United States Patent
Yakymyshyn et al.

(10) Patent No.: US 7,129,693 B2
(45) Date of Patent: *Oct. 31, 2006

(54) MODULAR VOLTAGE SENSOR

(75) Inventors: Christopher Paul Yakymyshyn, Seminole, FL (US); Michael Allen Brubaker, Loveland, CO (US); Pamela Jane Yakymyshyn, Seminole, FL (US)

(73) Assignee: FieldMetrics, Inc., Seminole, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/160,953

(22) Filed: Jul. 17, 2005

(65) Prior Publication Data

US 2006/0012382 A1    Jan. 19, 2006

Related U.S. Application Data

(60) Provisional application No. 60/521,902, filed on Jul. 19, 2004.

(51) Int. Cl.
- *G01R 1/20* (2006.01)
- *G01R 19/14* (2006.01)
- *G01R 27/26* (2006.01)
- *G01R 31/02* (2006.01)

(52) U.S. Cl. .................. 324/126; 324/133; 324/672; 324/72.5

(58) Field of Classification Search .............. None
See application file for complete search history.

(56) References Cited

U.S. PATENT DOCUMENTS

| | | | |
|---|---|---|---|
| 3,991,367 A | 11/1976 | Chapman et al. | 324/133 |
| 4,259,666 A | 3/1981 | Takahashi et al. | 340/647 |
| 4,507,701 A * | 3/1985 | Fujiwara et al. | 361/127 |
| 4,904,931 A | 2/1990 | Miller | 324/96 |
| 4,950,979 A | 8/1990 | Stegmuller et al. | 324/126 |
| 5,017,859 A | 5/1991 | Engel et al. | 324/127 |
| 5,077,520 A | 12/1991 | Schweitzer, Jr. | 324/133 |
| 5,083,124 A * | 1/1992 | Nordstrom | 340/853.1 |
| 5,729,888 A | 3/1998 | Abdelgawad et al. | 29/602.1 |
| 5,796,296 A | 8/1998 | Krentz | 327/545 |
| 5,883,508 A | 3/1999 | Ermisch et al. | 323/359 |
| 6,380,725 B1 | 4/2002 | Chavez et al. | 324/96 |
| 6,456,094 B1 | 9/2002 | Kuperman et al. | 324/676 |
| 6,459,252 B1 * | 10/2002 | Bierer | 324/72.5 |
| 6,677,743 B1 | 1/2004 | Coolidge et al. | 324/126 |
| 6,717,395 B1 | 4/2004 | Skendzic et al. | 324/117 R |
| 6,861,895 B1 * | 3/2005 | Liu et al. | 327/536 |

* cited by examiner

*Primary Examiner*—Andrew H. Hirshfeld
*Assistant Examiner*—Jeff Natalini

(57) ABSTRACT

A voltage sensor is described that consists of a plurality of identical series-connected sections, where each section is comprised of an arrangement of impedance elements. The sensor is optimized to provide an output ratio that is substantially immune to changes in voltage, temperature variations or aging. The voltage sensor can be scaled to various voltage levels by varying the number of series-connected sections.

18 Claims, 2 Drawing Sheets

MODULAR VOLTAGE SENSOR

CROSS REFERENCE TO PRIOR APPLICATION

This application claims the priority of U.S. Provisional Application Ser. No. 60/521,902 filed Jul. 19, 2004 and entitled "MODULAR VOLTAGE SENSOR", the subject matter of which is incorporated herein by reference.

FEDERAL GOVERNMENT STATEMENT

This invention was made with Government support under contract NBCHC040109 awarded by the Department of Homeland Security. The Government has certain rights to this invention.

FIELD OF THE INVENTION

The present invention relates to a voltage sensor for measuring voltage such as the voltage of a high-voltage power transmission line.

DESCRIPTION OF THE PRIOR ART

A variety of high-voltage measurement techniques are known in the art, including voltage transformers, capacitive voltage transformers, resistive voltage dividers, capacitive voltage dividers, mixed resistive-capacitive voltage dividers, electric field point sensors, line integral optical voltage sensors and distributed electric field point sensors.

U.S. Pat. No. 4,259,666 issued Mar. 31, 1981 discloses a method to measure the current flowing through a surge arrestor comprised of a stack of metal oxide resistors. Voltage measurements are not claimed. A resistor in parallel with a capacitor is connected between one end of the arrestor and ground. When current flowing through the arrestor becomes sufficiently large, a neon lamp connected in parallel with the resistor becomes illuminated, indicating that the arrestor performance has been degraded.

Disclosed in U.S. Pat. No. 5,729,888 issued Mar. 24, 1998 is a method of forming an integrated electrical system. As part of an encapsulated vacuum switch assembly, the patent discloses the use of an integrated voltage sensor to measure voltage on the power line. The voltage sensor is comprised of series-connected resistors forming a linear string between high voltage and ground. An additional string of resistors with wire hoops encircling the main resistor string at periodic locations provides shielding against capacitive coupling to electric field disturbing structures. The accuracy (both magnitude and phase angle) of the measurement string and the efficacy of the shielding method are questionable, since the AC impedance of the resistors must be high (>10 Megohms) to avoid excessive heating during operation. However, a low AC impedance (<1 Megohm) is required to achieve high measurement accuracy.

U.S. Pat. No. 6,717,395 issued Apr. 6, 2004 discloses the use of a current transformer as a voltage sensor. The capacitive coupling between the primary and secondary windings of a current transformer is used as the high voltage capacitor section of a capacitive divider. One side of the secondary winding of the current transformer is connected to ground through a second capacitor. The voltage across the capacitor is proportional to the voltage on the high voltage line. The method suffers from sensitivity to the capacitance between the primary and secondary windings of the current transformer, which varies with temperature and time. The voltage ratio also varies with capacitive coupling effects between the environment and the current transformer secondary cables.

U.S. Pat. No. 4,950,979, issued Aug. 21, 1990, discloses a resistive divider voltage sensor integrated into an insulating member. U.S. Pat. No. 5,796,296, issued Aug. 18, 1998 discloses a combined resistance-capacitance voltage divider circuit, wherein the resistors are connected in parallel with the capacitors, and the ratio of capacitors are set equal to the ratio of resistors to effect an accurate response over a broad bandwidth. U.S. Pat. No. 5,883,508, issued Mar. 16, 1999, discloses an ohmic resistive divider consisting of a single resistive element with taps, combined with capacitive shielding elements to compensate for ambient electromagnetic effects. U.S. Pat. No. 6,677,743, issued Jan. 13, 2004, discloses a voltage sensor using a plurality of voltage sensing devices spaced peripherally around a housing. U.S. Pat. No. 5,017,859 discloses a capacitive divider to measure voltage of a bus bar using a precisely controlled mechanical fixture. U.S. Pat. No. 5,077,520, issued Dec. 31, 1991, discloses a capacitive divider high impedance voltage indicator using a liquid crystal display as one of the capacitors in the divider. U.S. Pat. No. 6,456,094, issued Sep. 24, 2002, discloses a capacitive voltage divider consisting of a first capacitive divider, connected to a second capacitive divider, with additional resistance connected in parallel with the second capacitive divider to affect an improved response to long pulse duration voltage waveforms. U.S. Pat. No. 6,380,725, issued Apr. 30, 2002, discloses resistive shielding for a voltage sensor using at least one discrete electric field sensor. U.S. Pat. No. 3,991,367, issued Nov. 9, 1976, discloses a method for detecting the potential of a high-voltage transmission line using a capacitively coupled pickup electrode mounted in a suspension insulator and coupled through a rectifier circuit to a neon indicator. U.S. Pat. No. 4,904,931, issued Feb. 27, 1990, discloses an optical voltage sensor that uses a longitudinal Pockels cell connected between two conductors, and two optical signals with a phase shift between them to allow accurate reconstruction of the applied voltage between the two conductors.

The above-referenced prior art has one or more limitations in measurement performance, size, safety and cost. Inductive voltage transformers and capacitive voltage transformers use insulating polymeric solids, insulating oil or sulfur hexafluoride gas for insulation, resulting in a heavy or expensive device. Resistive voltage dividers must have a high electrical resistance to avoid excessive heating of the device. The high resistance causes the divider ratio to become very sensitive to external perturbations of the electric field distribution along the divider structure. The high resistance, when combined with the distributed capacitance of the structure, causes the high frequency response of the device to be limited. Capacitive voltage dividers can fail catastrophically if the elements comprising the divider fail in the short circuit condition. Large voltage transients with respect to time, or dV/dt, can cause a pure capacitive divider to fail because of the large displacement current that flows through the device. Electric field point sensors measure charge rather than potential, and their calibration is very sensitive to external perturbations of the electric field near the sensor. Line integral optical voltage sensors are physically small to keep costs affordable, and as a result they require insulating fluids and expensive housings to support the large electric fields near the sensor element. Distributed electric field point sensors provide a piece-wise approximation to the line integral voltage sensor, but require an operating environment that will not perturb the electric field distributions in close proximity to the individual sensor elements. For example, water vapor condensing on the electric field sensor will cause large errors in measurement. An expensive and continuously monitored housing is required to maintain the dry, insulating environment required for this approach.

SUMMARY OF THE PRESENT INVENTION

An objective of the present invention is to produce a high voltage sensor that simultaneously offers a wide frequency response, high accuracy of magnitude and phase angle measurements, a low weight, low cost, simple structure, insensitivity to external electric field perturbations, robustness against high voltage transients such as lightning transients, and a modular design where one or more identical sections are assembled into a complete sensor, with the number of sections determined by the voltage level being measured.

Briefly, a first aspect of the invention is a voltage sensor that uses a plurality of sections connected in series to form a complete device. Each section is comprised of a plurality of impedances connected in series to form a continuous length of impedance elements between the two ends of the section. The impedance element is preferably composed of a resistor in series with a capacitor. The string of sections is connected between two conductors held at different electrical potentials. An output signal is provided by measuring the voltage across one of the impedance elements contained within one of the sections in the string.

The present invention reduces the deficiencies inherent in existing high voltage sensor technologies.

The invention eliminates the need for insulating oil and sulfur hexafluoride gas, resulting in a lighter weight device with little or no maintenance required.

The invention provides a voltage measurement that is insensitive to temperature changes.

The invention provides a voltage measurement that is insensitive to variations in the electric field distribution near the device.

The invention can achieve measurement accuracies of 0.1% in amplitude, and 0.03 degrees in phase angle for an AC voltage applied to the invention.

The invention is able to handle high values of dV/dt voltage transients without failing.

The signal bandwidth of the invention can be made large, extending from less than 1 Hz to greater than 1 MHz.

The invention can be scaled to a variety of voltages by adjusting the number of impedance elements in each section or by varying the number of sections in a complete device.

DETAILED DESCRIPTION OF THE PREFERRED EMBODIMENTS

Figure 1:
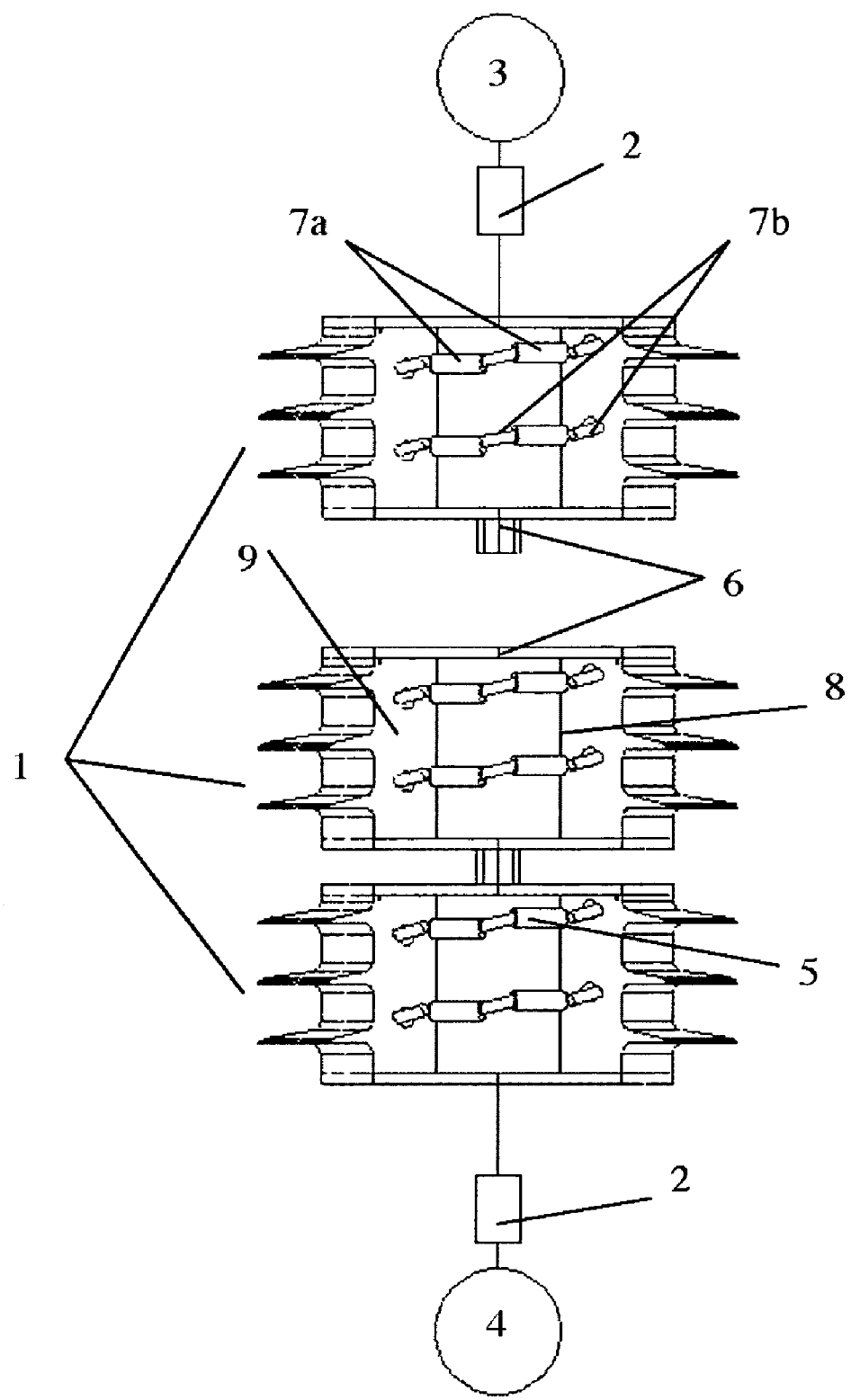
FIG. 1 is a diagram of several sections of a modular voltage sensor.

A modular voltage sensor is described (shown in FIG. 1) having a modular high voltage arm in series with one or more low voltage impedance elements 2 between two conductors 3 and 4 at different electrical potentials. The high voltage arm is comprised of one or more modular sections 1 stacked in series as needed to allow operation at any voltage level. Each modular section has mounting hardware 6 for making mechanical and electrical connections to adjacent sections in the stack. An output signal is provided by measuring the voltage across a low voltage impedance element 2 at one or both ends of the modular high voltage arm. Each modular section of the divider structure is contained within an insulating housing made from porcelain or polymer with weather sheds 10 on the exterior surface. Each modular section 1 of the high voltage arm is comprised of a plurality of alternating impedances 7a and 7b connected in series to form one or more impedance strings 5. Impedance 7a is a capacitor and impedance 7b is a resistor. The impedance strings 5 are fastened to an insulating support tube 8 and/or potted in a suitable insulation material 9. The impedances 7a and 7b for the modular sections 1 are selected to meet particular performance criteria that depend on the application of the divider. The impedance strings within each modular section are distributed in an optimal fashion for voltage grading, with the preferred embodiments being coiled shapes having cross sections including but not limited to circular or square. Each string starts at a different angular location at the top of the section. For example, if two strings are used, then the starting locations are located 180 degrees apart at the top of the section. For n strings, the starting locations are spaced by 360/n degrees. The total number of elements in the string is determined by the maximum allowed voltage across the divider, divided by the maximum allowed voltage across each impedance element The coil shape, pitch, diameter, total number of rotations, impedance element length and cross-sectional area of the single or multiple strings are inter-related. The claimed invention selects these parameters for the individual modular high voltage arm sections to uniformly grade the potential between the two conductors over a wide range of frequencies.

Equipment used for power distribution and transmission applications in the electric utility industry must meet strict type testing requirements defined in ANSI C57.13, IEC 60044.7, and IEC 60044.8, among other standards. These standards define the basic insulation level (BIL) of the complete device. Both 60 Hz applied voltage tests and lightning impulse voltage tests are required for all devices, and switching surge voltage tests are also required for higher voltage class equipment. To meet all of these test requirements, the electric field in the region between the two conductors must not exceed the threshold required to initiate an electrical discharge, as this can cause equipment failure. The electric field amplitude and distribution must therefore remain well controlled for both 60 Hz voltages and lightning impulse voltages having significant energy carried by frequency components above 100 kHz. A modular section of the high voltage arm may be configured to meet or exceed the ANSI C29 requirements for porcelain string insulators.

The present invention achieves the required voltage grading by placing a capacitive and a resistive element in series to form an impedance element that is the building block for the impedance string or strings within the modular sections of the high voltage arm. The capacitive element is selected to sustain a high 60 Hz AC voltage across its terminals, while the resistor element is selected to handle the average power dissipated with a 60 Hz voltage applied. The resistor element is also selected to withstand the peak voltage experienced during the application of a lightning impulse, to safely absorb the total energy contained in the lightning impulse, and to limit the time rate of voltage change across the capacitor. The capacitor is selected to safely carry the peak currents associated with the lightning impulse voltage waveform with the series resistor in place. The capacitor can be specified by the maximum allowed time derivative of the applied voltage (dV/dt), since this is related to the peak current capability of the capacitor by I=C dV/dt, where C is the capacitance of the capacitor.

In one embodiment of the invention, the impedance element consists of a polymeric capacitor having values ranging from 10 pico-Farads to 10 micro-Farads, in series with an encapsulated, wire-wound resistor having a value between 100 Ohms and 10,000 Ohms. This selection provides excellent voltage grading between the two conductors over a wide range of frequencies.

The modular voltage divider can be used to accurately measure the voltage between two conductors. This is accomplished by monitoring the voltage across one or more of the impedance elements, which is smaller than the applied voltage by $V_2=V_1 Z_1/(Z_{total})$ where $Z_1$ is the impedance across which the measured voltage $V_2$ appears, $V_1$ is the applied voltage between the two conductors, and $Z_{total}$ is the total impedance of the impedance string or strings. $Z_1$ can be one or more of the impedance elements that make up the string or strings within the modular high voltage arm sections. Since the elements all have an identical thermal coefficient of impedance, voltage coefficient of impedance and long term drift, the divider ratio will be substantially unaffected by temperature, applied voltage and aging.

In addition to measuring the magnitude of a voltage, the voltage divider must also maintain accurate phase angle between the applied voltage and the measurement signal. The magnitude and phase of the measurement are affected by external objects coupling to the impedance string or strings 5 through the air, by voltages existing on additional nearby conductors, and by a low input impedance of the electronic circuitry that is connected to the output of the divider. Each of these effects must be considered in the design of the divider.

Each modular section of the high voltage arm is contained within an insulating housing 9 made from porcelain or polymer with weather sheds 10 on the exterior surface. Semi-conductive coatings such as melting ice, pollution or salt water deposited onto the sheds can severely distort the voltage distribution near the divider. External objects such as other electrical conductors at different voltages or support structures at ground potential can capacitively couple to the impedance string or strings 5, resulting in a change in the divider ratio. This is a common source of error for impedance dividers.

To minimize these effects, the insulator housing for each modular high voltage arm section 1 can be made with a large diameter to physically move the sources of perturbations away from the divider. The ratio of the insulator length to the insulator diameter should preferably be in the range of 0.05 to 20. As an alternative or additional measure, the impedance of the complete device can be reduced as much as possible, provided the power dissipation in the impedance string or strings within the modular sections does not become excessively high while voltage is applied. The use of multiple parallel strings effectively provides this, even when the strings are not electrically connected to the same circuitry at each end. For example, a divider with two identical modular strings can have one string connected as a voltage divider with ratio R1, and the second string connected as a voltage divider with ratio R2. The capacitive coupling between strings is small and does not significantly change the individual string ratios. However, each modular string shields the other from external perturbations by halving the impedance between the two conductors.

Figure 2:
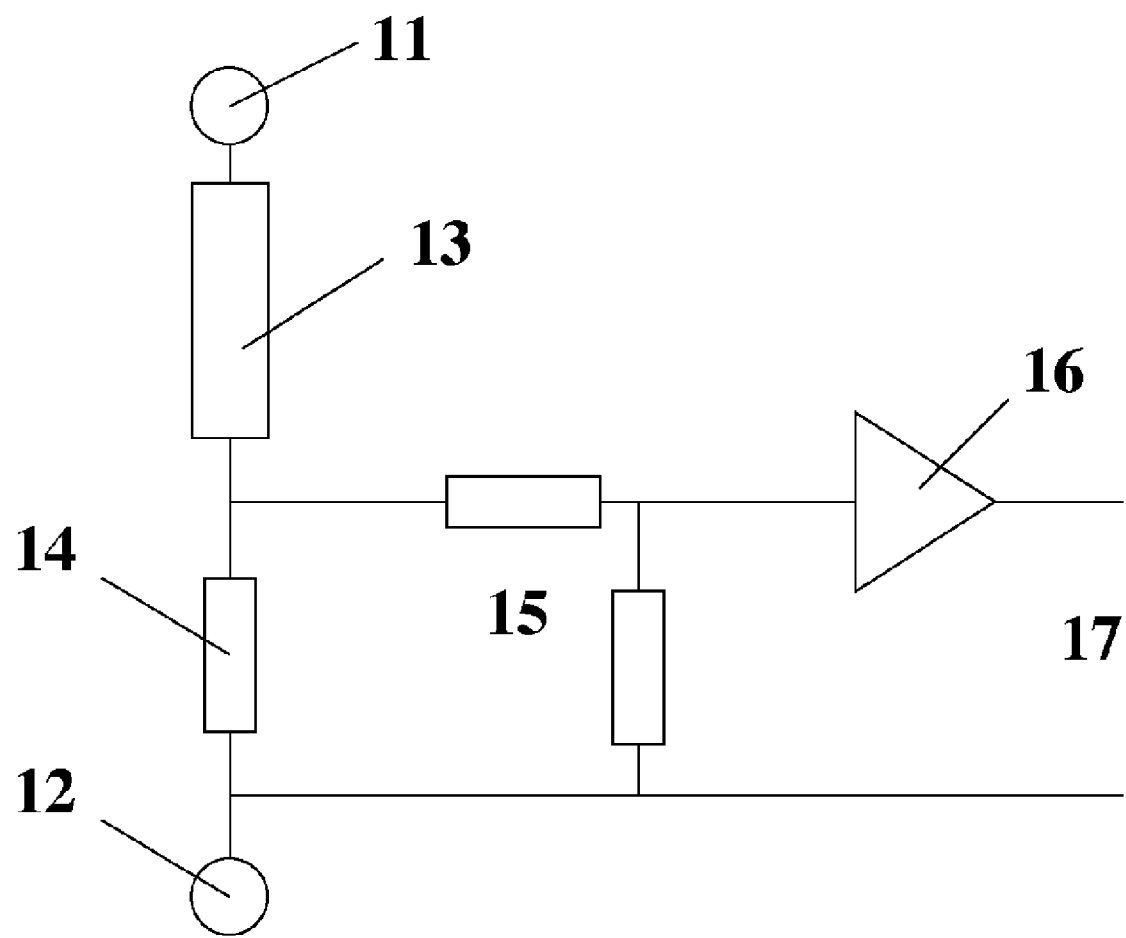
FIG. 2 is a schematic diagram of the modular voltage sensor.

FIG. 2 is a block diagram of the modular voltage sensor, including the amplifier. The two conductors 11 and 12 have connected between them a series of impedance strings 13 (and identified as $Z_{total}-Z_1$) in series with a single impedance element 14 (and identified as $Z_1$). A second voltage divider 15 is formed using two impedance elements with differing impedance values. The output of the second voltage divider is amplified by an electronic amplifier 16 to generate an output voltage or current 17 that is an accurate representation of the voltage difference between conductors 11 and 12.

The input impedance of the electronic amplifier 16 and the second voltage divider are in parallel with the single impedance element 14, changing the voltage at the top of the single impedance element and altering the divider ratio. The phase error introduced by this loading can be compensated by either using an amplifier with a very high input impedance Z (where Z>1000 $Z_1$), a very high impedance in the second voltage divider 15, or by adjusting $Z_1$ to compensate for the additional input impedance in parallel with impedance element 14. In many cases it is difficult to have high input impedances, since often the second resistive divider is required to reduce the voltage to a level suitable for use with conventional electronic amplifiers. For the case of a string of impedance elements comprised of a resistor in series with a capacitor, the impedance element $Z_1$ has been modified to be a capacitor in series with an optimized value of resistor. The resulting output signal has a ratio of more than 1000:1 and a phase error of <0.1 degrees.

The invention has been reduced to practice for module sections consisting of two impedance strings configured as interwoven coils with the following results. The ratio magnitude and phase angle remains stable to within +/−0.2% over a temperature range of −40 to +80 degrees Celsius. The ratio is changed by 0.05% when a large conductive, grounded plate is situated three feet from the device. The ratio changes by 0.1% when aluminum foil sheets are placed on sections of the insulator sheds to severely distort the electric field distribution. The ratio remains stable to 0.1% over a wide range of voltages from 100 VAC to 25,000 VAC. The modular high voltage arm sections passed dielectric type testing including wet and dry AC withstand, full and chopped lightning impulse and partial discharge tests required for various power distribution and transmission applications. All tests were performed in accordance with IEEE Standard 4-1995.

The modular voltage sensor concept has been demonstrated by stacking lower voltage units on top of each other to form a device rated for higher voltages. External corona shields may be required to reduce electric fields near the divider impedance string(s).

For some applications, the voltage can be monitored across one or more impedance elements on each end of the impedance string. This allows measurement of the voltage between the two conductors by electronic circuits located and electrically connected to each conductor. For other applications, the output of the amplifier circuit can feed an additional power amplifier (with an output power capability of >50 Volt-Amperes) that can directly control an electromechanical relay commonly used in power utility systems.

What is claimed is:

1. A device to measure the voltage difference between two conductors, comprised of a high voltage arm consisting of more than one identical modular sections connected in series; where the electrical connections between modular sections are electrically insulated from the external environment; where each modular section is constructed from a plurality of series-connected identical electrical impedance elements distributed in one or more high voltage impedance strings; where each impedance string has the form of a spiral that is intertwined with one or more additional impedance strings such that each spiral-formed impedance string provides dielectric shielding for the other spiral-formed impedance strings; where each impedance element is comprised of a resistor in series with a capacitor; where one or more low voltage arms are comprised of strings of one or more impedance elements; where one or more low voltage arms are electrically connected in series with one end or both ends of the high voltage arm, across which a voltage is measured relative to the first or second conductors connected across the device terminals; and where one or more electronic circuits amplify the signals across one or more of the low voltage arm impedance elements and provide corrections for one or more of the ratios between the measured voltage difference and one or more of the output signals.

2. The device in claim 1 where an electronic amplifier is used to generate an output voltage or current having sufficient power source or sink capability to directly operate an electromechanical relay.

3. The device in claim 1 where the high voltage arm modular section impedance string or strings are formed into one or more intertwined spirals extending between the two ends of each high voltage modular section and creates a structure having a uniform grading of voltage along its length for 60 Hz and higher frequencies including power line harmonics and the impulse spectrum for both lightning and switching waveforms.

4. The device in claim 1 where the impedance elements in each high voltage arm modular section are mounted on a single dielectric tube that spans between the two ends of said high voltage arm modular section.

5. The dielectric tube in claim 4 where a wet filament wound glass tube with a resin binder is utilized to provide a means of mounting the elements comprising the impedance string or strings in each high voltage arm modular section.

6. The device in claim 1 where the capacitors comprising the impedance string are arranged on the inside of an insulating support tube and the resistors comprising the impedance string are arranged on the outside of the tube to provide mechanical support of the individual capacitors and resistors, and to provide electrical shielding of the electrical leads on the individual resistors and capacitors.

7. The device in claim 1 where the temperature coefficient of impedance of the impedance element(s) comprising the impedance string or strings of the low voltage arm is chosen to match the temperature coefficient of impedance of the impedance elements comprising the impedance string or strings of the high voltage arm.

8. The device in claim 1 where the voltage coefficient of impedance of the impedance element(s) comprising the impedance string or strings of the low voltage arm is chosen to match the voltage coefficient of impedance of the impedance elements comprising the impedance string or strings of the high voltage arm.

9. The device in claim 1 where the long-term drift of impedance of the impedance element(s) comprising the impedance string or strings of the low voltage arm is chosen to match the long-term drift of impedance of the impedance elements comprising the impedance string or strings of the high voltage arm.

10. The device in claim 1 where the impedance of the low voltage arm element(s) is chosen to compensate for phase shifts in the output signal caused by the finite input impedance of additional circuitry connected across the low voltage arm elements.

11. The device in claim 1 where the impedance element is comprised of a wound film-foil capacitor.

12. The device in claim 1 where the impedance element is comprised of a resistor selected from, but not limited to, a wire-wound resistor, a thin film resistor or a thick film resistor.

13. The device in claim 1 where the impedance string or strings for each modular section of the high voltage arm are placed in a suitable dielectric medium (gas, liquid or solid) to prevent electrical breakdowns from initiating on the external surfaces of the impedance elements.

14. The device in claim 1 where each modular section of the high voltage arm satisfies the mechanical dielectric and reliability requirements of a permanently installed conventional porcelain or composite suspension insulator.

15. The device in claim 1 where the impedance strings comprising each modular section of the high voltage arm are cast in a suitable electrically insulating dielectric material, including, but not limited to epoxy.

16. The device in claim 15 where the casting material is formed to create external weather sheds to improve the external flashover performance of the high voltage arm sections.

17. The device in claim 15 where silicone rubber is cast over the impedance string casting material to create external weather sheds to improve the external flashover performance of the modular high voltage arm sections.

18. The device in claim 1 where each modular section is connected to adjacent modular sections using a flexible linkage consisting of a ball and socket.

* * * * *